United States Patent
Bataineh

(10) Patent No.: US 8,090,335 B1
(45) Date of Patent: Jan. 3, 2012

(54) METHOD AND APPARATUS FOR AN ADAPTIVE STEP FREQUENCY CALIBRATION

(75) Inventor: Khaldoun Bataineh, Austin, TX (US)

(73) Assignee: Xilinx, Inc., San Jose, CA (US)

( * ) Notice: Subject to any disclaimer, the term of this patent is extended or adjusted under 35 U.S.C. 154(b) by 1002 days.

(21) Appl. No.: 11/484,192

(22) Filed: Jul. 11, 2006

(51) Int. Cl.
| | |
|---|---|
| H03J 7/32 | (2006.01) |
| H04B 1/06 | (2006.01) |
| H04B 7/00 | (2006.01) |
| H03L 7/06 | (2006.01) |
| H03L 7/00 | (2006.01) |
| H03D 3/24 | (2006.01) |
| G06F 1/00 | (2006.01) |

(52) U.S. Cl. ........ 455/260; 455/147; 455/255; 455/258; 327/156; 331/16; 331/17; 375/373; 375/376; 713/300

(58) Field of Classification Search ................ 455/522, 455/183, 183.1, 75–78, 85–87, 119–125, 455/165.1, 173.1–179.1, 180.3, 182.1–182.3, 455/183.2, 255, 260, 130, 147, 258; 327/105, 327/106, 107, 115, 117, 147, 156, 157, 158, 327/198, 261, 544; 331/1, 1 R, 11, 14, 16, 331/17, 18, 25, 44, 167, 177 V, 185, 10, 34, 331/127, 176; 375/326, 373, 374, 375, 376; 713/300

See application file for complete search history.

(56) References Cited

U.S. PATENT DOCUMENTS

| | | | |
|---|---|---|---|
| 5,257,294 A | 10/1993 | Pinto | |
| 5,390,346 A * | 2/1995 | Marz | 455/260 |
| 5,748,046 A * | 5/1998 | Badger | 331/17 |
| 5,939,911 A * | 8/1999 | Humphreys et al. | 327/147 |
| 5,970,106 A * | 10/1999 | Izumikawa | 375/376 |
| 6,215,835 B1 | 4/2001 | Kyles | |
| 6,624,674 B1 * | 9/2003 | Zhao | 327/156 |
| 6,724,265 B2 | 4/2004 | Humphreys | |
| 6,859,509 B1 * | 2/2005 | Koudelka | 375/373 |
| 7,352,249 B2 * | 4/2008 | Balboni et al. | 331/16 |
| 7,635,997 B1 | 12/2009 | Samad | |

(Continued)

FOREIGN PATENT DOCUMENTS

JP 03091320 A * 4/1991

OTHER PUBLICATIONS

U.S. Appl. No. 11/035,773, filed Jan. 14, 2005, Batainch et al.

*Primary Examiner* — Nay A Maung
*Assistant Examiner* — Paul P Tran
(74) *Attorney, Agent, or Firm* — Michael T. Wallace; John J. King

(57) ABSTRACT

An open loop frequency calibration algorithm is employed whereby frequency counters are utilized to provide frequency information concerning the difference in frequency between a local oscillator and a reference signal prior to obtaining phase locked operation of a phase locked loop (PLL). The frequency difference is then used to adjust the local oscillator's frequency to be changed by a value that is proportional to the frequency difference measured. Through adaptive calibration of the local oscillator's frequency prior to closed loop PLL operations, a substantial reduction in the amount of time required to obtain phase/frequency coherent operation of the PLL is realized.

20 Claims, 5 Drawing Sheets

U.S. PATENT DOCUMENTS

| | | |
|---|---|---|
| 2002/0030520 A1* | 3/2002 | Ooishi .......................... 327/156 |
| 2002/0075080 A1 | 6/2002 | Nelson et al. |
| 2003/0042985 A1* | 3/2003 | Shibahara et al. .............. 331/17 |
| 2003/0155981 A1* | 8/2003 | Dey ................................ 331/16 |
| 2004/0242175 A1* | 12/2004 | Lin ................................ 455/147 |
| 2006/0145769 A1 | 7/2006 | Vaananen et al. |
| 2007/0002992 A1* | 1/2007 | Sindalovsky et al. ......... 375/373 |

\* cited by examiner

METHOD AND APPARATUS FOR AN ADAPTIVE STEP FREQUENCY CALIBRATION

FIELD OF THE INVENTION

The present invention generally relates to phase/frequency locked loops, and more particularly to adaptive calibration of oscillators used in phase/frequency locked loops.

BACKGROUND

Communication developments in the last decade have demonstrated what seems to be a migration from parallel data input/output (I/O) interface implementations to a preference for serial data I/O interfaces. Some of the motivations for preferring serial I/O over parallel I/O include reduced system costs through reduction in pin count, simplified system designs, and scalability to meet the ever increasing bandwidth requirements of today's communication needs. Serial I/O solutions will most probably be deployed in nearly every electronic product imaginable, including IC-to-IC interfacing, backplane connectivity, and box-to-box communications.

Although the need for increased communication bandwidth continues to drive future designs, support for the lower bandwidth legacy systems is needed. As such, the future designs are required to provide a wide range of scalability, whereby data rate, slew rate, and many other physical (PHY) layer attributes are adaptable. For example, a particular transmitter/receiver (TX/RX) pair may be configured for use as both a high-definition serial digital interface (HD-SDI) and a standard-definition serial digital interface (SD-SDI). Both standards have similar specifications, but differ from each other at the PHY layer with respect to, for example, bit rate and edge rate. In order to provide a cost effective solution for both interfaces, the same transmitter/receiver pair may be required to adapt to both specifications by changing its mode of operation.

The bit rate, for example, of the PHY layer may determine the particular mode of operation that is implemented by each transceiver. To maintain phase/frequency coherency, each transceiver may employ a phase locked loop (PLL), whereby the PLL phase and frequency aligns a locally generated clock, e.g., a voltage controlled oscillator (VCO), to an external reference clock or data signal.

In order to achieve a phase/frequency locked state in a shorter amount of time, a conventional frequency calibration process may be employed. In particular, the VCO's output frequency is programmed, prior to closing the PLL's control loop, to be within a programmable frequency range of the reference clock frequency or data signal frequency. Conventionally, a frequency detection circuit has been employed to determine a coarse frequency relationship between the VCO output frequency and the reference clock frequency, i.e., whether the two clock frequencies are within a predetermined frequency range of one another and which of the two signals is operating at a frequency higher than the other. Such an arrangement is disclosed in Bataineh et al., U.S. patent application Ser. No. 11/035,773 filed Jan. 14, 2005, and is incorporated herein by reference in its entirety The coarse frequency relationship is then utilized by a conventional calibration circuit, whereby a fixed frequency step size is used to increase or decrease the output frequency of the VCO. The frequency detection circuit is then used to determine when the relationship between the VCO frequency and the reference frequency has changed, i.e., when the VCO frequency relative to the reference frequency has transitioned from higher to lower, or from lower to higher.

Several disadvantages exist, however, when calibration of the VCO frequency is performed using a fixed frequency step size. First, if the frequency difference between the VCO frequency and the reference frequency is large, then a proportional amount of time is required to step the VCO frequency to within the predetermined frequency range of the reference frequency. Second, if a large frequency step size is used, time may be wasted by continuously undershooting and overshooting the predetermined frequency range by under-stepping or over-stepping the VCO frequency. Third, if the VCO frequency begins at a frequency that is relatively close to the reference frequency, then applying a large frequency step size may actually tune the VCO frequency even further away from the reference frequency.

Accordingly, advanced calibration methods continue to be developed to further decrease the amount of time required to obtain frequency/phase coherency with a reference frequency. Such an advanced calibration method would be particularly useful in programmable, multi-frequency capable circuits, such as programmable logic devices (PLDs), that utilize programmable serial communication transceivers over a wide frequency range of operation.

SUMMARY

To overcome limitations in the prior art, and to overcome other limitations that will become apparent upon reading and understanding the present specification, various embodiments of the present invention disclose an apparatus and method for adaptive calibration of a local oscillator of a phase/frequency locked loop.

In accordance with one embodiment of the invention, a method of operating a phase locked loop (PLL), comprises disconnecting a phase correction device that is used to correct errors between a local oscillator (LO) signal and a reference signal to perform a calibration function. The calibration function includes comparing the LO signal and the reference signal to obtain a relative frequency difference between the LO signal and the reference signal and adjusting a control voltage in proportion to the relative frequency difference to adaptively adjust a frequency of the LO signal to be within a programmable range of a frequency of the reference signal. The method further includes reconnecting the phase correction device after completion of the calibration function to allow the PLL to correct errors between the LO signal and the reference signal.

In accordance with another embodiment of the invention, a phase/frequency correction circuit comprises a phase locked loop (PLL) that is adapted to maintain phase/frequency coherence between a local oscillator (LO) signal and a reference signal during a first phase of operation. The phase/frequency correction circuit further comprises a frequency detection circuit that is coupled to the PLL and is adapted to measure a relative frequency difference between the LO signal and the reference signal during a second phase of operation. The phase/frequency correction circuit further comprises a frequency calibration circuit that is coupled to the frequency detection circuit and the PLL. The frequency calibration circuit is adapted to adjust the frequency of the LO signal in proportion to the relative frequency difference between the LO signal and the reference signal during a second phase of operation. The PLL is deactivated during the second phase of operation.

In accordance with another embodiment of the invention, an integrated circuit (IC) comprises a serial communications transceiver that includes a phase locked loop (PLL) that is adapted to maintain coherence between a local oscillator (LO) signal and a reference signal during a first phase of operation. The serial communications transceiver further includes a frequency detection circuit that is coupled to the PLL and is adapted to measure relative frequency differences between the LO signal and the reference signal during a second phase of operation. The serial communications transceiver further includes a frequency calibration circuit that is coupled to the frequency detection circuit and the PLL. The frequency calibration circuit is adapted to adjust the frequency of the LO signal in proportion to the relative frequency difference between the LO signal and the reference signal during a second phase of operation. The PLL is deactivated during the second phase of operation.

BRIEF DESCRIPTION OF THE DRAWINGS

Various aspects and advantages of the invention will become apparent upon review of the following detailed description and upon reference to the drawings in which.

DETAILED DESCRIPTION

Generally, the various embodiments of the present invention are applied to coherent serial communications. In particular, an adaptive algorithm is employed, whereby the frequency step size used to calibrate the frequency of a local oscillator (LO), such as a voltage controlled oscillator (VCO) of a phase locked loop (PLL), is determined based upon the measured frequency relationship between the VCO frequency and a reference frequency.

A frequency detection algorithm is employed whereby two frequency counters, for example, are utilized to provide relative frequency information concerning the frequency of the VCO and the frequency of a reference signal. Such a frequency relationship is valuable, when adaptive calibration of the VCO frequency relative to the reference signal frequency is desired.

For example, prior to obtaining phase/frequency coherency between the VCO clock signal and a reference signal via a phase/frequency correction device, such as a PLL, it is often desirable, if not necessary, to tune the VCO clock signal's frequency to within a pull-in range of the frequency of the reference signal. As an alternative to simply tuning the frequency of the VCO clock signal in fixed frequency increments, frequency counters are instead used to determine the frequency difference between the VCO clock signal and the reference signal. As such, the frequency difference allows adaptive tuning of the VCO clock signal frequency by setting the step size of the VCO's frequency adjustment to be substantially equal to the frequency difference measured. Thus, adaptive calibration of the VCO substantially reduces the amount of time required to obtain phase/frequency coherent operation between the VCO clock signal and a reference signal by reducing the number of VCO tuning iterations required during adaptive calibration.

Figure 1:
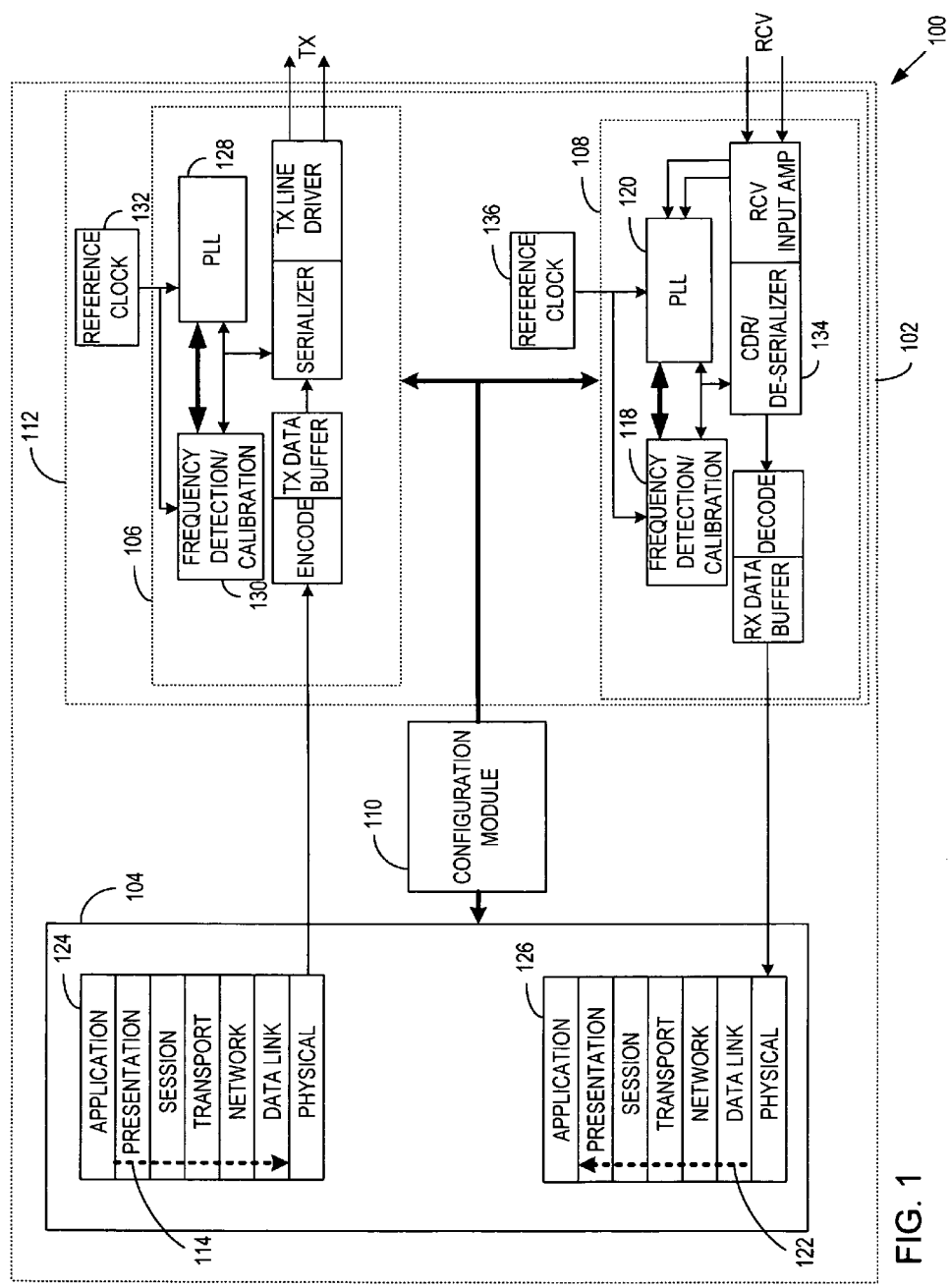
FIG. 1 illustrates an exemplary, phase locked loop (PLL) based communication block diagram.

Turning to FIG. 1, exemplary block diagram 100 is illustrated in which integrated circuit (IC) 102 conducts coherent serial communications with external communications equipment (not shown), whereby the use of VCO based PLLs is exemplified. In one embodiment, IC 102 may represent a field programmable gate array (FPGA), whereby configurable logic portion, i.e., fabric 104, and related processor supported functions are used to implement communication stacks 124 and 126 in support of the various communication protocols that may be supported by IC 102.

Using such an arrangement, data frames outbound from FPGA fabric 104 may propagate from, for example, the application layer to the physical layer of communication stack 124 via communication path 114. Similarly, data frames inbound to FPGA fabric 104 may propagate from, for example, the physical layer to the application layer of communication stack 126 via communication path 122.

Multi-gigabit transceiver (MGT) 112 implements the physical media attachment (PMA) and the physical coding sublayer (PCS) via transmitter 106 and receiver 108, which are included within the physical layers of communication stacks 124 and 126, respectively. Included with the PMA function, for example, are the deserializer and clock and data recovery (CDR) 134, the serializer functions of transmitter 106, the transmitter line driver, and the receiver input amplifier.

Included with the PCS function, is the encoding/decoding function where, for example, 8B/10B or 64B/66B encoding/decoding is performed. The PCS function may also perform scrambling/descrambling functions and elastic buffering in support of channel bonding and clock correction. In support of the configuration and/or partial reconfiguration of FPGA fabric 104 and MGT 112 is configuration module 110, which may provide an on-board microprocessor, to further enable communication protocol support as well as maintenance functionality.

In one embodiment, a digital receiver implementation may be facilitated, whereby digital CDR 134 and PLL 120 are employed to provide frequency coherency with the received data stream, RCV. In operation, receiver 108 is configured to over-sample the input data stream, RCV, for data rates at or below a threshold frequency, such as for example, 1.25 Gbps. Phase locked loop (PLL) 120 provides de-serializer 134 with a clock reference signal that is phase coherent with reference clock 136, the clock reference signal operating at a frequency adequate to provide the level of over-sampling that is required.

In an alternate embodiment, CDR 134 is instead utilized to generate the reference clock signal to PLL 120, whereby the reference clock signal is derived from the rising and falling edges of input data stream, RCV. PLL 120 then operates to maintain phase coherency between the reference clock signal and an internal VCO (not shown) and may also provide PLL 128 with a reduced phase noise clock reference signal that is phase/frequency coherent with input data stream RCV. PLL 128 may then generate the high speed clock signal for the TX line driver, so that the outgoing data stream, TX, may be transmitted in phase/frequency coherency with the input data stream, RCV.

Figure 3:
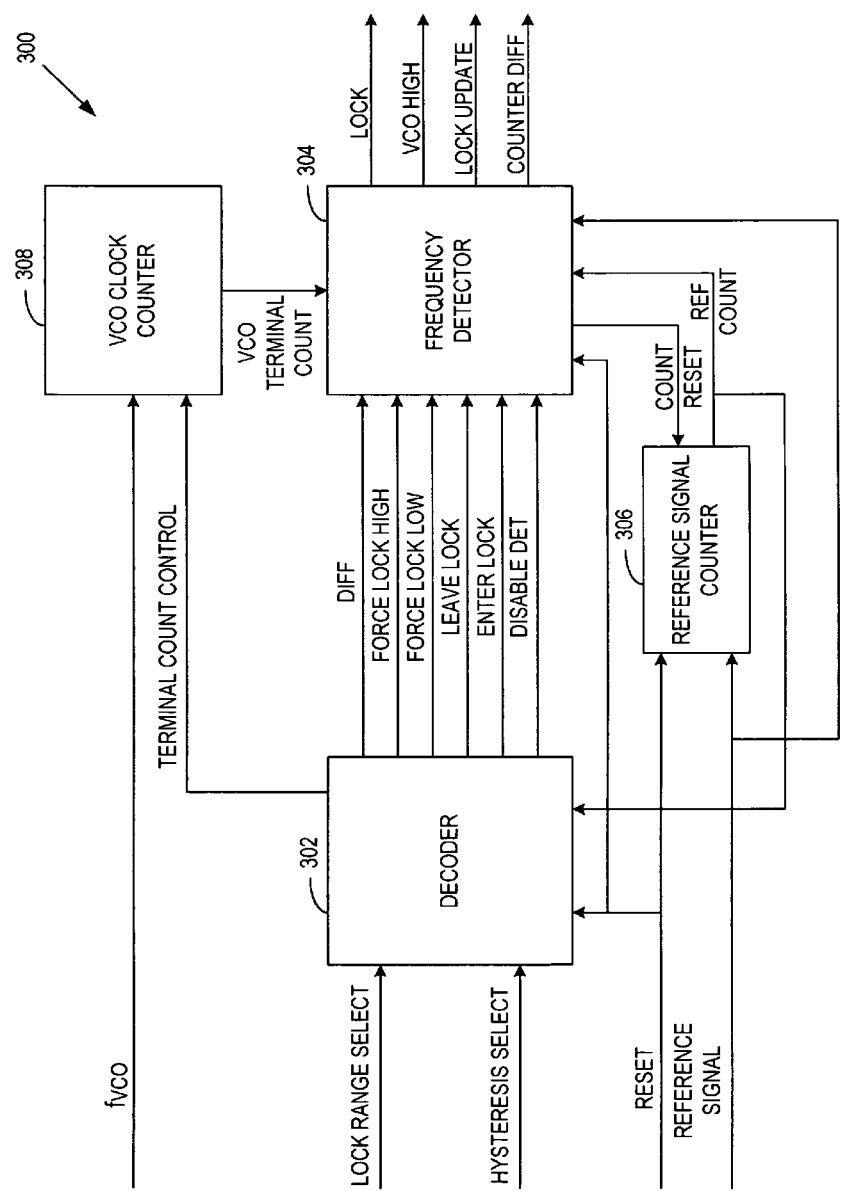
FIG. 3 illustrates an exemplary block diagram of a frequency detection block.

Frequency detection/calibration blocks 118 and 130 are also provided that implement two main functions: frequency detection and frequency calibration. Frequency detection, as discussed in more detail below in regard to FIG. 3, is performed by first comparing the frequency of the VCO (not shown) within PLLs 120 and/or 128 to the known frequency of the reference signal coming from either of reference clocks 136, 132 or CDR 134. Next, the difference between the two frequencies is compared to a programmable frequency range. If the difference is larger than the programmable frequency range, then the two frequencies are said to be "out-of-lock" with one another, and it is further determined as to which of the two frequencies is higher.

This information is then used by the frequency calibration function of frequency detection/calibration blocks 118 and 130, as discussed in more detail below in regard to FIGS. 4 and 5, to adaptively adjust the VCO frequency. In particular, the frequency step size that is used to tune the VCO frequency during frequency calibration is calculated from the frequency difference as measured by the frequency detection block.

Figure 2:
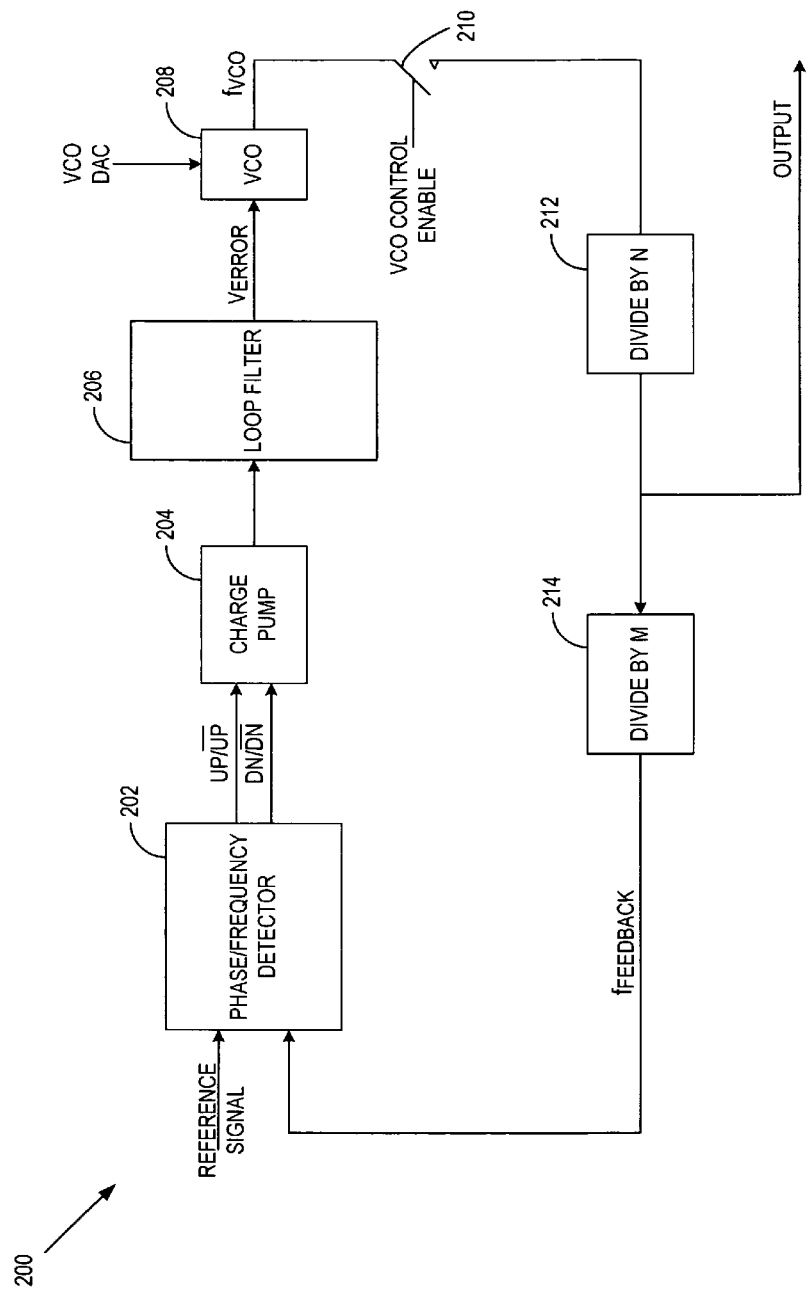
FIG. 2 illustrates an exemplary schematic diagram of the PLL of FIG. 1.

Turning to FIG. 2, an exemplary block diagram of PLL 200 is illustrated, which may be used to implement PLLs 120 and 128 of FIG. 1. PLL 200 exemplifies a charge-pump based PLL (CPLL), which is an attractive PLL design implementation that facilitates flexible design tradeoffs by decoupling various design parameters, such as loop bandwidth, damping factor, and lock range. CPLL 200 consists of, for example, phase/frequency detector 202, charge pump 204, loop filter 206, LO 208, which may be implemented as a voltage controlled oscillator (VCO), calibration switch 210, and dividers 212-214 that may be used in PLL applications requiring clock division.

Clock division may be necessary, for example, when the output frequency of VCO 208 is operative in a high frequency range, such as 5 gigahertz (GHz), but REFERENCE SIGNAL may only be operating at a relatively low frequency range, such as 156.25 megahertz (MHz). Furthermore, signal OUTPUT may be desired at an intermediate frequency range, such as 1.25 GHz. In such an instance, a clock division of 32 is implemented through the use of feedback division, such that a 156.25 MHz reference signal, REFERENCE SIGNAL, may be compared in both phase and frequency to the 5 GHz output of VCO 208. As such, the feedback frequency, $f_{FEEDBACK}$, may be generated in accordance with equation (1):

$$f_{FEEDBACK} = f_{VCO}/(M*N), \quad (1)$$

where $f_{VCO}$ is the output frequency of VCO 208, N is the integer divisor provided by divider 212, and M is the integer divisor provided by divider 214. In this instance, N may be set to 4 and M may be set to 8, since 5 GHz/(4*8)=156.25 MHz, which is equal to the frequency of REFERENCE SIGNAL. In addition, signal OUTPUT is operating at an intermediate frequency of 5 GHz/4=1.25 GHz.

In a closed loop phase of operation, i.e., when switch 210 is closed as selected by signal VCO CONTROL ENABLE, phase/frequency detector 202 supplies digital signals, e.g., UP and DN, and their complementary signals, e.g., $\overline{UP}$ and $\overline{DN}$, corresponding to the phase/frequency error between REFERENCE SIGNAL and $f_{FEEDBACK}$. For example, if the phase/frequency of $f_{FEEDBACK}$ is lagging the phase/frequency of REFERENCE SIGNAL, then the pulse width of signal UP may increase and the pulse width of signal DN may decrease to cause the phase/frequency of VCO 208 to be advanced in phase/frequency. Conversely, if the phase/frequency of $f_{FEEDBACK}$ is advanced with respect to the phase/frequency of signal REFERENCE SIGNAL, then the pulse width of signal UP may decrease and the pulse width of signal DN may increase to cause the phase/frequency of VCO 208 to be retarded in phase/frequency.

Charge pump 204 reacts to the phase/frequency error signals by generating a current signal in response to the phase/frequency error signals. For example, if the pulse width of signal UP is increased, the magnitude of the current signal may also increase. Conversely, if the pulse width of signal DN is increased, then the magnitude of the current signal may also decrease.

The current signal is then converted into an error voltage, $V_{ERROR}$, by loop filter 206, which is then supplied to VCO 208 to set the output frequency, $f_{VCO}$, of VCO 208. Through negative feedback, the phase/frequency error between REFERENCE SIGNAL and $f_{FEEDBACK}$ is forced to be substantially zero through operation of PLL 200. By changing the value of divisors, M and/or N, signal OUTPUT may be programmed to operate over a frequency range of one or more frequency decades as required by the particular application, while maintaining frequency/phase coherency with REFERENCE SIGNAL. It should be noted that REFERENCE SIGNAL may correspond to an external reference signal, as generated for example by REFERENCE CLOCK 136 and/or 132 of FIG. 1. Conversely, REFERENCE SIGNAL may instead correspond to the derived frequency of input data stream, RCV, as discussed above in relation to CDR 134 of FIG. 1.

In an open loop phase of operation, i.e., when switch 210 is open as selected by signal VCO CONTROL ENABLE, the output frequency of VCO 208 may be calibrated as discussed in more detail below. Generally, signal $V_{ERROR}$ has no control over the frequency of $f_{VCO}$ while in the open loop phase of operation. Instead, signal VCO DAC is adaptively programmed to adjust, or calibrate, the frequency of signal $f_{VCO}$ to an appropriate frequency as determined by the frequency detection and calibration circuits of FIGS. 3 and 4.

In particular, signal VCO DAC may be generated by a digital to analog converter (DAC) (not shown) that is responsive to a digital input that corresponds to the nominal frequency target of the VCO signal, such that $f_{VCO}$ is set within a programmable frequency range that is proportional (depending upon the value of divisors N and M) to the REFERENCE SIGNAL frequency during adaptive calibration. Hereinafter, operation is discussed as if divisors N and M are both set to unity.

Turning to FIG. 3, an exemplary block diagram of frequency detection block 300 is illustrated, as may be implemented by frequency detection/calibration blocks 118 and 130 of FIG. 1. Decoder 302 receives the programmable pull-in range signal, LOCK RANGE SELECT, and the programmable tracking range signal, HYSTERESIS SELECT, from configuration module 110 to select the frequency difference between signal $f_{VCO}$ and REFERENCE SIGNAL that may be tolerated, while achieving and maintaining a locked state. Tables 1 and 2 tabulate exemplary lock ranges and hysteresis ranges that may be programmed into decoder 302 via signals LOCK RANGE SELECT and HYSTERESIS SELECT, respectively.

TABLE 1

| LOCK RANGE SELECT | Compare | Lock Lower | Lock Upper | Detect Range |
|---|---|---|---|---|
| 000 | 16384 | 16380 | 16387 | 0.024% |
| 001 | 8192 | 8188 | 8195 | 0.049% |
| 010 | 4096 | 4092 | 4099 | 0.098% |
| 011 | 2048 | 2044 | 2051 | 0.195% |
| 100 | 1024 | 1020 | 1027 | 0.391% |
| 101 | 512 | 508 | 515 | 0.781% |
| 110 | 256 | 252 | 259 | 1.563% |
| 111 | 128 | 124 | 131 | 3.125% |

TABLE 2

| HYSTERESIS SELECT | Number of Counts |
|---|---|
| 000 | +/−4 |
| 001 | +/−8 |
| 010 | +/−16 |
| 011 | +/−32 |
| 100 | +/−64 |
| 101 | +/−128 |
| 110 | +/−256 |
| 111 | +/−512 |

Taking a typical example, LOCK RANGE SELECT may be programmed to $011_b$ and HYSTERESIS SELECT may be programmed to $101_b$. As such, the low lock value is decoded by decoder 302 to 2044, the high lock value is decoded to 2051, and the hysteresis range is decoded to 2048+/−128, or 1920-2045 and 2052-2175. Next, frequency comparison between $f_{VCO}$ and REFERENCE SIGNAL is performed using ripple counters 308 and 306, respectively, where ripple counter 308 is clocked by signal $f_{VCO}$ and ripple counter 306 is clocked by signal REFERENCE SIGNAL. VCO clock counter 308 runs continuously, while reference signal counter 306 is stopped, reset, and restarted at regular intervals as determined from the decoded values of LOCK RANGE SELECT and the value of VCO TERMINAL COUNT from VCO clock counter 308, which corresponds to the "Compare" column of Table 1.

In particular, each time VCO clock counter overflows, the frequency error between signal $f_{VCO}$ and REFERENCE SIGNAL is checked in accordance with the following sequence. First, a terminal count indication, VCO TERMINAL COUNT, is provided by VCO clock counter 308 to indicate that it has reached its terminal count value, as programmed by signal TERMINAL COUNT CONTROL from decoder 302, where the terminal count value of VCO clock counter 308 corresponds to the "Compare" column values of Table 1. Next, signal REF COUNT from reference signal counter 306 is sampled and stored within decoder 302. Next, the count value of reference signal counter 306 is reset via signal COUNT RESET and then restarted via signal RESET. Signal REF COUNT is then compared to the corresponding "Compare" value of Table 1, e.g., 2048, that corresponds to the programmed value of LOCK RANGE SELECT, e.g., $011_b$.

It should be noted, that since signal REF COUNT is stored, the delay associated with resetting and restarting reference signal counter 306 is not important. In addition, reference signal counter 306 is not reset to a count value of zero, but is rather preset to a count value that is equal to the number of counts that would have transpired during the sample, reset, and restart cycle of reference signal counter 306. In this way, any cycles unaccounted for during the sample, reset, and restart cycle may be compensated through the preset value.

In this example, LOCK RANGE SELECT is programmed to $011_b$, which corresponds to a VCO clock counter 308 terminal count value of 2048. The difference between the stored value of signal REF COUNT and the terminal count of 2048 is then calculated and provided on the signed, multiple bit signal DIFF, which is then reflected at the signed, multiple bit signal COUNTER DIFF by frequency detector 304. Next, a comparison between the stored value of signal REF COUNT and the terminal count renders one of eight lock state conditions as tabulated in Table 3.

TABLE 3

| Lock State Condition | Previous lock state | Comparison | Current lock state |
|---|---|---|---|
| 1 | Unlocked | REF COUNT < TC & REF COUNT < LLL | Remain unlocked |
| 2 | Unlocked | REF COUNT < TC & REF COUNT > LLL | Enter lock |
| 3 | Unlocked | REF COUNT > TC & REF COUNT < ULL | Enter lock |
| 4 | Unlocked | REF COUNT > TC & REF COUNT > ULL | Remain unlocked |
| 5 | Locked | REF COUNT < TC & REF COUNT < LHL | Leave lock |
| 6 | Locked | REF COUNT < TC & REF COUNT > LHL | Remain locked |
| 7 | Locked | REF COUNT > TC & REF COUNT < UHL | Remain locked |
| 8 | Locked | REF COUNT > TC & REF COUNT > UHL | Leave lock |

Lock state condition 1: If the previous lock state is UNLOCKED, the stored value of signal REF COUNT is smaller than the terminal count (TC), e.g., 2048, and smaller than the decoded lower lock limit (LLL), e.g., 2044, as in lock state condition 1, then the current lock state remains unlocked. The unlocked condition is signaled by deasserting signal LOCK. Since the stored value of signal REF COUNT is smaller than TC, signal VCO HIGH is asserted to indicate that signal $f_{VCO}$ is at a higher frequency than REFERENCE SIGNAL.

Lock state condition 2: If the previous lock state is UNLOCKED, the stored value of signal REF COUNT is smaller than the terminal count (TC), e.g., 2048, but larger than the decoded lower lock limit (LLL), e.g., 2044, as in lock state condition 2, then the current lock state enters the locked state. The locked condition is signaled by asserting signals ENTER LOCK and LOCK. Since the stored value of signal REF COUNT is smaller than TC, signal VCO HIGH is asserted to indicate that signal $f_{VCO}$ is at a higher frequency than REFERENCE SIGNAL.

Lock state condition 3: If the previous lock state is UNLOCKED, the stored value of signal REF COUNT is larger than the terminal count (TC), e.g., 2048, but smaller than the decoded upper lock limit (ULL), e.g., 2051, as in lock state condition 3, then the current lock state enters the locked state. The locked condition is signaled by asserting signals ENTER LOCK and LOCK. Since the stored value of signal REF COUNT is larger than TC, signal VCO HIGH is deasserted to indicate that signal $f_{VCO}$ is at a lower frequency than REFERENCE SIGNAL.

Lock state condition 4: If the previous lock state is UNLOCKED, the stored value of signal REF COUNT is larger than the terminal count (TC), e.g., 2048, and larger than the decoded upper lock limit (ULL), e.g., 2051, as in lock state condition 4, then the current lock state remains unlocked. The unlocked condition is signaled by deasserting signal LOCK. Since the stored value of signal REF COUNT is larger than TC, signal VCO HIGH is deasserted to indicate that signal $f_{VCO}$ is at a lower frequency than REFERENCE SIGNAL.

Lock state condition 5: If the previous lock state is LOCKED, the stored value of signal REF COUNT is smaller than the terminal count (TC), e.g., 2048, and smaller than the decoded lower hysteresis limit (LHL), e.g., 1920, as in lock state condition 5, then the current lock state leaves the locked state. The unlocked condition is signaled by deasserting signal LOCK and asserting signal LEAVE LOCK. Since the stored value of signal REF COUNT is smaller than TC, signal VCO HIGH is asserted to indicate that signal $f_{VCO}$ is at a higher frequency than REFERENCE SIGNAL.

Lock state condition 6: If the previous lock state is LOCKED, the stored value of signal REF COUNT is smaller than the terminal count (TC), e.g., 2048, but larger than the decoded lower hysteresis limit (LHL), e.g., 1920, as in lock state condition 6, then the current lock state remains in the locked state. The locked condition is signaled by leaving signal LOCK in its asserted state. Since the stored value of signal REF COUNT is smaller than TC, signal VCO HIGH is asserted to indicate that signal $f_{VCO}$ is at a higher frequency than REFERENCE SIGNAL.

Lock state condition 7: If the previous lock state is LOCKED, the stored value of signal REF COUNT is larger than the terminal count (TC), e.g., 2048, but smaller than the decoded upper hysteresis limit (UHL), e.g., 2175, as in lock state condition 7, then the current lock state remains in the locked state. The locked condition is signaled by leaving signal LOCK in its asserted state. Since the stored value of signal REF COUNT is larger than TC, signal VCO HIGH is deasserted to indicate that signal $f_{VCO}$ is at a lower frequency than REFERENCE SIGNAL.

Lock state condition 8: If the previous lock state is LOCKED, the stored value of signal REF COUNT is larger than the terminal count (TC), e.g., 2048, and larger than the decoded upper hysteresis limit (UHL), e.g., 2175, as in lock state condition 8, then the current lock state leaves the locked state. The unlocked condition is signaled by deasserting signal LOCK and asserting signal LEAVE LOCK. Since the stored value of signal REF COUNT is larger than TC, signal VCO HIGH is deasserted to indicate that signal $f_{VCO}$ is at a lower frequency than REFERENCE SIGNAL.

Signal LOCK UPDATE is asserted if the logic state of signal LOCK and/or the logic state of signal VCO HIGH changes as discussed above. Signals FORCE LOCK HIGH and FORCE LOCK LOW may be asserted/deasserted in conjunction with signal DISABLE DET. In particular, the frequency detection circuitry of frequency detector 304 may be disabled through assertion of signal DISABLE DET. Furthermore, while the frequency detection circuitry is disabled, signal LOCK may nevertheless by asserted/deasserted by signals FORCE LOCK HIGH//FORCE LOCK LOW irrespective of the current lock state condition to effectively disable adaptive frequency calibration of VCO 208.

Figure 4:
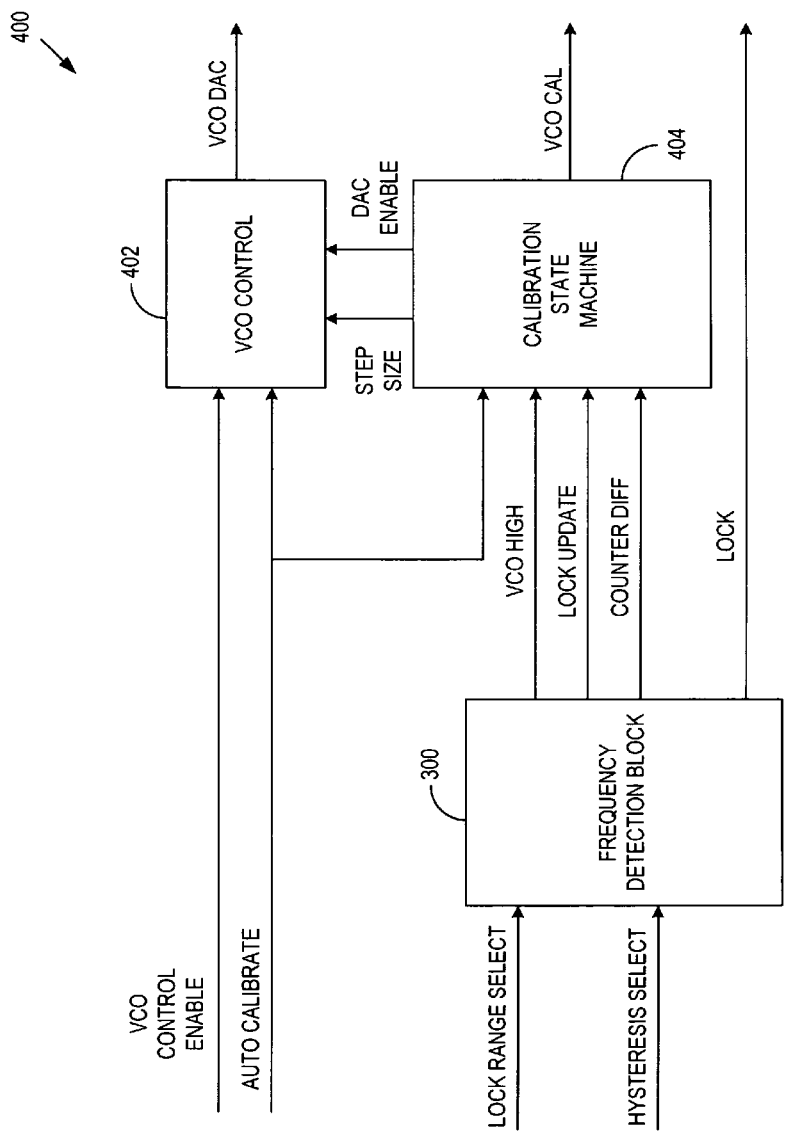
FIG. 4 illustrates an exemplary block diagram of a frequency calibration block.
Figure 5:
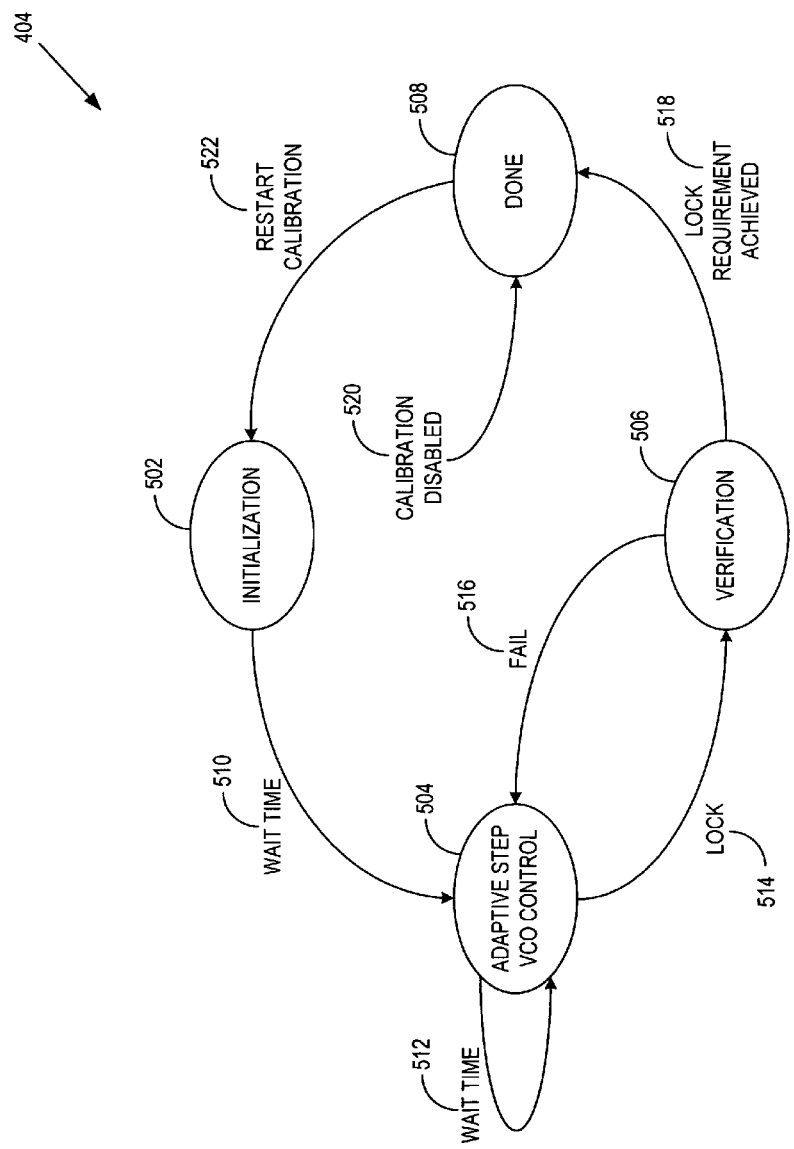
FIG. 5 illustrates an exemplary state machine diagram of the calibration state machine of FIG. 4.

Turning to FIGS. 4 and 5, operation of the adaptive frequency calibration will now be explained, whereby FIG. 5 provides details of the operation of calibration state machine 404 of FIG. 4. As discussed above in relation to FIG. 2, switch 210 is opened during the adaptive frequency calibration phase of operation, to allow control of the output frequency of VCO 208 via VCO control signal VCO DAC.

In particular, signal VCO DAC is generated by VCO CONTROL 402 of FIG. 4 to adaptively program signal $f_{VCO}$ into a locked condition state, as discussed above in relation to FIG. 3 and Table 3, during a calibration phase of operation. Configuration module 110 of FIG. 1, for example, may assert signals VCO CONTROL ENABLE and AUTO CALIBRATE to activate the calibration phase of operation. Calibration state machine 404 then provides both the DAC ENABLE signal and the STEP SIZE signal, as calculated by equation (2) below, to VCO control 402, so that VCO 208 may be adaptively calibrated prior to the closed loop phase of operation. Signal VCO CAL may be provided by calibration state machine 404 to signal the calibration phase of operation.

Signal STEP SIZE, is adaptively programmed by calibration state machine 404 to provide, via VCO control 402 and signal VCO DAC, appropriate control of signal $f_{VCO}$ from VCO 208 of FIG. 2. If signal VCO HIGH is asserted and frequency detection block 300 reports an unlocked condition via signal LOCK UPDATE, for example, then signal STEP SIZE is adaptively adjusted downward, as described by equation (2) below, in proportion to signal COUNTER DIFF to decrease the frequency of signal $f_{VCO}$. If, on the other hand, signal VCO HIGH is deasserted and frequency detection block 300 reports an unlocked condition via signal LOCK UPDATE, for example, then signal STEP SIZE is adaptively adjusted upward, as described by equation (2) below, in proportion to signal COUNTER DIFF to increase the frequency of signal $f_{VCO}$.

Calibration state machine 404 begins operations at initialization state 502, whereby all calibration registers are updated with initial values. Initialization state 502 may be entered from state transition 522 in one of 3 instances: 1) from startup; 2) from hard reset; or 3) from a loss of lock condition as discussed above in relation to FIG. 3 and Table 3. Once wait time 510 has expired, adaptive step VCO control state 504 may be entered.

In state 504, the calibration step size is calculated in response to signal COUNTER DIFF as generated by frequency detection block 300 of FIG. 3. In particular, a new step value that is based upon the calibration step size is either added to or subtracted from signal VCO DAC, so that the output frequency of VCO 208 may be tuned to a frequency that is closer to the frequency of REFERENCE SIGNAL. Thus, by calculating a new step value through the use of signal COUNTER DIFF in an adaptive frequency step loop, convergence to the desired VCO frequency may be obtained in a shorter amount of time.

Equation (2), for example, may be used by state 504 to determine the new step value to be added to signal VCO DAC as follows:

$$Newstepvalue = \frac{D*R*X}{(referencecounter*freqdiff)}. \quad (2)$$

X is the absolute value of signal COUNTER DIFF, R is the frequency of REFERENCE SIGNAL, D is the VCO clock division factor, e.g., as defined by divisors M and N of FIG. 2, referencecounter is the value of signal REF COUNT as described in FIG. 3, and freqdiff is the frequency resolution in MHz of the DAC (not shown) within VCO control 402 that is used to provide signal VCO DAC.

Once signal VCO DAC has been updated by signal newstepvalue, as calculated by equation (2), wait time 512 is initiated to allow VCO 208 to settle before attempting to make a new frequency measurement. Once the frequency measurement yields a lock determination, as discussed above in relation to FIG. 3 and Table 3, then verification state 506 is entered. In particular, verification state 506 performs consecutive frequency measurements to obtain a threshold number of consecutive lock indications.

For example, 3 consecutive frequency measurements may be executed by verification state 506, and if 3 consecutive lock indications are obtained, then state transition 518 is executed to indicate that a proper lock requirement has been achieved. Once the proper lock requirement has been achieved, switch 210 may be closed to give control back to PLL 200 of FIG. 2. PLL 200 control is necessary in order to correct for any phase/frequency differences between signal $f_{VCO}$ and REFERENCE SIGNAL that may exist once the adaptive frequency calibration process is complete.

If, however, lock verification fails, then execution passes back to adaptive step VCO control state 504 via state transition 516. As such, adaptive step control of VCO control signal VCO DAC is repeated as discussed above. Operation continues between states 504 and 506 until a proper lock verification is obtained. State transition 520 may also be used to bypass VCO calibration altogether as discussed above in relation to FIG. 3.

Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A method of operating a phase locked loop (PLL), comprising:
    disconnecting a phase correction device used to correct errors between a local oscillator (LO) signal and a reference signal to perform a calibration function during an open loop operation of the PLL to set a frequency of the LO signal, the calibration function including,
        comparing the LO signal and the reference signal to obtain a relative frequency difference between the LO signal and the reference signal;
        calculating a step size signal based upon the relative frequency difference; and
        adjusting a control voltage in proportion to the relative frequency difference based upon the step size signal to adaptively adjust the frequency of the LO signal to be within a programmable range of a frequency of the reference signal, wherein the step size signal is adaptively adjusted to perform the calibration function;
    reconnecting the phase correction device after completion of the calibration function within the programmable range to allow the PLL to correct errors between the LO signal and the reference signal;
    monitoring the LO signal and the reference signal; and
    disconnecting the phase correction device to perform the calibration function during another open loop operation of the PLL if an unlocked state of the LO signal is detected based upon the programmable range.

2. The method of claim 1, wherein disconnecting the phase correction device comprises preventing error information to be used by the PLL to adjust the LO signal.

3. The method of claim 1, wherein comparing the LO signal and the reference signal comprises counting the frequency of the LO signal.

4. The method of claim 3, wherein comparing the LO signal and the reference signal further comprises counting the frequency of the reference signal until the count of the frequency of the LO signal reaches a programmable value.

5. The method of claim 4, wherein comparing the LO signal and the reference signal further comprises storing the count of the frequency of the reference signal in response to the count of the frequency of the LO signal reaching the programmable value.

6. The method of claim 5, wherein comparing the LO signal and the reference signal further comprises comparing the stored count of the frequency of the reference signal to the programmable value to obtain the relative frequency difference.

7. The method of claim 6, wherein adjusting the control voltage comprises:
    adjusting the control voltage in response to the relative frequency difference being larger than the programmable range; and
    verifying that the frequency of the LO signal is within the programmable range prior to reconnecting the phase correction device.

8. A phase/frequency correction circuit, comprising:
    a phase locked loop (PLL) adapted to maintain phase/frequency coherence between a local oscillator (LO) signal and a reference signal during a first phase of operation;
    a frequency detection circuit coupled to the PLL and adapted to measure a relative frequency difference between the LO signal and the reference signal during a second phase of operation; and
    a frequency calibration circuit coupled to the frequency detection circuit and the PLL to enable a calibration function during an open loop operation of the PLL in the second phase of operation to set a frequency of the LO signal or reset the frequency of the LO signal to within a programmable range if an unlocked state of the LO signal is detected based upon the programmable range, the frequency calibration circuit adapted to adjust the frequency of the LO signal in proportion to the relative frequency difference between the LO signal and the reference signal according to a step size signal which is calculated based upon the relative frequency difference and adjusted to adaptively calibrate the LO signal during the second phase of operation.

9. The phase/frequency correction circuit of claim 8, wherein the PLL comprises:
    a voltage controlled oscillator (VCO) programmably coupled to provide the LO signal; and
    a phase/frequency detector programmably coupled to receive the LO signal and coupled to receive the reference signal.

10. The phase/frequency correction circuit of claim 9, wherein the frequency detection circuit comprises a first counter coupled to receive the LO signal and adapted to provide a fixed count indicative of the frequency of the LO signal, wherein the fixed count corresponds to a terminal count of the first counter.

11. The phase/frequency correction circuit of claim 10, wherein the frequency detection circuit further comprises a second counter coupled to receive the reference signal and adapted to provide a second count in response to the terminal count of the first counter, wherein a difference between the second count and the terminal count is indicative of the relative frequency difference.

12. The phase/frequency correction circuit of claim 11, wherein the frequency detection circuit further comprises a decoder coupled to receive the second count and adapted to provide the difference between the second count and the terminal count.

13. The phase/frequency correction circuit of claim 12, wherein the frequency detection circuit further comprises a frequency detector coupled to the decoder and the first and second counters, the frequency detector being adapted to provide a lock indication if the difference between the second count and the terminal count is within a programmable lock range.

14. The phase/frequency correction circuit of claim 13, wherein the frequency calibration circuit comprises a calibration state machine coupled to receive the difference between the second count and the terminal count and adapted to provide an adaptive step size value of the step size signal in proportion to the difference between the second count and the terminal count.

15. The phase/frequency correction circuit of claim 14, wherein the frequency calibration circuit further comprises an LO control block coupled to receive the adaptive step size value and adapted to provide an LO control signal to the VCO, the LO control signal being effective to reduce the difference between the terminal count and the second count to be within the programmable lock range.

16. An integrated circuit (IC), comprising:
a serial communications transceiver including a phase locked loop (PLL) adapted to maintain coherence between a local oscillator (LO) signal and a reference signal during a first phase of operation, the serial communications transceiver further including,
  a frequency detection circuit coupled to the PLL and adapted to measure relative frequency differences between the LO signal and the reference signal during a second phase of operation; and
  a frequency calibration circuit coupled to the frequency detection circuit and the PLL to enable a calibration function during an open loop operation of the PLL in the second phase of operation to set a frequency of the LO signal or reset the frequency of the LO signal to within a programmable range if an unlocked state of the LO signal is detected based upon the programmable range, the frequency calibration circuit adapted to adjust the frequency of the LO signal in proportion to the relative frequency difference between the LO signal and the reference signal according to a step size signal which is calculated based upon the relative frequency difference and adjusted to adaptively calibrate the LO signal during the second phase of operation.

17. The IC of claim 16, wherein the frequency detection circuit comprises a first counter coupled to receive the LO signal and adapted to provide a fixed count indicative of the frequency of the LO signal, wherein the fixed count corresponds to a terminal count of the first counter.

18. The IC of claim 17, wherein the frequency detection circuit further comprises a second counter coupled to receive the reference signal and adapted to provide a second count in response to the terminal count of the first counter, wherein a difference between the terminal count and the second count is indicative of the relative frequency difference.

19. The IC of claim 18, wherein the frequency detection circuit further comprises:
  a decoder coupled to receive the second count and adapted to provide the difference between the terminal count and the second count; and
  a frequency detector coupled to the decoder and the first and second counters, the frequency detector being adapted to provide a lock indication if the difference between the terminal count and the second count is within a programmable lock range.

20. The IC of claim 19, wherein the frequency calibration circuit comprises:
  a calibration state machine coupled to receive the difference between the terminal count and the second count and adapted to provide an adaptive step size value of the step size signal in proportion to the difference between the terminal count and the second count; and
  an LO control block coupled to receive the adaptive step size value and adapted to provide an LO control signal, the LO control signal being effective to reduce the difference between the terminal count and the second count to be within the programmable lock range.

\* \* \* \* \*